US012796275B2

United States Patent
(12) United States Patent
Sun et al.

(10) Patent No.: US 12,796,275 B2
(45) Date of Patent: Nov. 10, 2026

(54) DISPLAY PANEL, DISPLAY DEVICE AND METHOD FOR MANUFACTURING DISPLAY PANEL

(71) Applicant: BOE TECHNOLOGY GROUP CO., LTD., Beijing (CN)

(72) Inventors: Qian Sun, Beijing (CN); Qian Jin, Beijing (CN); Wei Huang, Beijing (CN); Yu Tian, Beijing (CN); Tianhao Lu, Beijing (CN); Yang Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 397 days.

(21) Appl. No.: 18/568,357

(22) PCT Filed: Jun. 18, 2021

(86) PCT No.: PCT/CN2021/100908
§ 371 (c)(1),
(2) Date: Dec. 8, 2023

(87) PCT Pub. No.: WO2022/261941
PCT Pub. Date: Dec. 22, 2022

(65) Prior Publication Data
US 2024/0276828 A1 Aug. 15, 2024

(51) Int. Cl.
*H10K 59/38* (2023.01)
*H10K 59/122* (2023.01)
(Continued)

(52) U.S. Cl.
CPC ........... *H10K 59/38* (2023.02); *H10K 59/122* (2023.02); *H10K 59/35* (2023.02); *H10K 59/873* (2023.02);
(Continued)

(58) Field of Classification Search
CPC ......... H10K 59/38; H10K 59/32; H10K 50/19
See application file for complete search history.

(56) References Cited

U.S. PATENT DOCUMENTS

2015/0014661 A1 1/2015 Joo et al.
2018/0061911 A1 3/2018 Sun et al.
(Continued)

FOREIGN PATENT DOCUMENTS

CN 105514295 A 4/2016
CN 105576004 A 5/2016
(Continued)

*Primary Examiner* — Evan G Clinton
(74) *Attorney, Agent, or Firm* — WHDA, LLP

(57) ABSTRACT

A display panel includes a light-emitting substrate, a first wavelength conversion layer and a second wavelength conversion layer. The light-emitting substrate includes multiple light-emitting structures corresponding to the pixels respectively, at least one light-emitting structure includes one or more first light-emitting layers emitting a first waveband light and one or more second light-emitting layers emitting a second waveband light laminated one on another, and a wavelength of the first waveband light is smaller than a wavelength of the second waveband light. The first wavelength conversion layer has multiple first wavelength conversion patterns corresponding to the light-emitting structures, the first wavelength conversion patterns are configured to perform up-conversion on the second waveband light emitted through the second light-emitting layers. The second wavelength conversion layer has multiple second wavelength conversion patterns corresponding to the light-emitting structures.

20 Claims, 14 Drawing Sheets

(51) Int. Cl.
*H10K 59/35* (2023.01)
*H10K 59/80* (2023.01)
*H10K 71/13* (2023.01)

(52) U.S. Cl.
CPC ....... *H10K 59/8792* (2023.02); *H10K 71/135* (2023.02); *H10K 59/8731* (2023.02)

(56) References Cited

U.S. PATENT DOCUMENTS

| | | | | |
|---|---|---|---|---|
| 2020/0091464 | A1 | 3/2020 | Park et al. | |
| 2021/0359007 | A1 | 11/2021 | Lu et al. | |
| 2022/0085334 | A1* | 3/2022 | Oh | H10K 59/871 |

FOREIGN PATENT DOCUMENTS

| | | | | |
|---|---|---|---|---|
| CN | 108878497 | A | | 11/2018 |
| CN | 109817686 | A | * | 5/2019 |
| CN | 110911447 | A | | 3/2020 |
| CN | 111785850 | A | | 10/2020 |
| KR | 20150006605 | A | | 1/2015 |

* cited by examiner

DISPLAY PANEL, DISPLAY DEVICE AND METHOD FOR MANUFACTURING DISPLAY PANEL

CROSS-REFERENCE TO RELATED APPLICATION

The present application is the U.S. national phase of PCT Application No. PCT/CN2021/100908 filed on Jun. 18, 2021, which is incorporated by reference herein in its entirety.

TECHNICAL FIELD

The present disclosure relates to the field of semiconductors technology, in particular to a display panel, a display device and a method for manufacturing a display panel.

BACKGROUND

With the development of display technology, the display quality of display devices is increasingly demanded. As a new luminescent material, quantum dot material has such advantages as concentrated luminescence spectrum, high color purity, and that the luminescence color can be easily adjusted through a size, structure or composition of the quantum dot material. Quantum dot ink is processed in solution, spin-coated or ink-jet printed, and further cured to form a quantum dot color film, which is a new generation of luminescent materials applied in solid state lighting and full-color flat panel display.

SUMMARY

The present disclosure provides a display panel, a display device and a method for manufacturing a display panel. The display panel having a plurality of pixels, and the display panel includes a light-emitting substrate, a first wavelength conversion layer and a second wavelength conversion layer. The light-emitting substrate includes a plurality of light-emitting structures corresponding to the pixels respectively, at least one light-emitting structure includes one or more first light-emitting layers emitting a first waveband light and one or more second light-emitting layers emitting a second waveband light laminated one on another, and a wavelength of the first waveband light is smaller than a wavelength of the second waveband light. The first wavelength conversion layer has a plurality of first wavelength conversion patterns corresponding to the light-emitting structures, the first wavelength conversion patterns are arranged at a light-exiting side of at least part of the light-emitting structures and configured to perform up-conversion on the second waveband light emitted through the second light-emitting layers. The second wavelength conversion layer is arranged on a side of the first wavelength conversion layer away from the light-emitting substrate and has a plurality of second wavelength conversion patterns corresponding to the light-emitting structures, the second wavelength conversion patterns being configured to perform down-conversion on light emitted through the first wavelength conversion layer.

In a possible embodiment of the present disclosure, the plurality of pixels includes a red pixel, a green pixel and a blue pixel, the first light-emitting layer emits blue light, the second light-emitting layer emits green light, and the first wavelength conversion patterns are arranged at the light-exiting side of the light-emitting structures corresponding to the red pixel and the blue pixel.

In a possible embodiment of the present disclosure, the light-emitting structure includes one first light-emitting layer and one second light-emitting layer.

In a possible embodiment of the present disclosure, the light-emitting structure includes two first light-emitting layers and one second light-emitting layer, the second light-emitting layer being arranged between the two first light-emitting layers.

In a possible embodiment of the present disclosure, the two first light-emitting layers are made of a same light-emitting layer material.

In a possible embodiment of the present disclosure, a first wavelength conversion pattern corresponding to the red pixel is made of a material different from a first wavelength conversion pattern corresponding to the green pixel.

In a possible embodiment of the present disclosure, the plurality of pixels includes a red pixel, a green pixel and a blue pixel, the first light-emitting layer emits blue light, the second light-emitting layer emits yellow light, and the first wavelength conversion patterns are arranged at the light-exiting side of the light-emitting structures corresponding to blue pixels.

In a possible embodiment of the present disclosure, the display panel includes an encapsulation layer arranged between the light-emitting substrate and the second wavelength conversion layer, and the encapsulation layer includes a first inorganic encapsulation layer, an organic encapsulation layer arranged on a side of the first inorganic encapsulation layer away from the light-emitting substrate, and a second inorganic encapsulation layer arranged on a side of the organic encapsulation layer away from the first inorganic encapsulation layer. The first wavelength conversion layer is arranged between the first inorganic encapsulation layer and the organic encapsulation layer.

In a possible embodiment of the present disclosure, when the first wavelength conversion patterns are arranged at the light-exiting side of the light-emitting structures corresponding to the red pixel and the blue pixel, the organic encapsulation layer includes a first filling part filled in the green pixel, and the first filling part has substantially a same thickness as the first wavelength conversion patterns.

In a possible embodiment of the present disclosure, when the first wavelength conversion patterns are arranged at the light-exiting side of the light-emitting structures corresponding to the blue pixels, the organic encapsulation layer includes a second filling part filled in the green pixel and a third filling part filled in the red pixel. The second filling part and the third filling part have substantially a same thickness as the first wavelength conversion patterns.

In a possible embodiment of the present disclosure, at least one first wavelength conversion pattern includes a base and luminescent particles dispersed in the base, a material of the luminescent particles including: a sulfate, and at least one of Sc, Y, La, Gd or Lu dispersed in the sulfate.

In a possible embodiment of the present disclosure, the base is made of a same material as the organic encapsulation layer.

In a possible embodiment of the present disclosure, the display panel further includes a first pixel definition layer configured to define the plurality of light-emitting structures, the first pixel definition layer having a plurality of first openings corresponding to the pixels respectively, the first wavelength conversion patterns being arranged within the first openings.

In a possible embodiment of the present disclosure, the display panel further includes a second pixel definition layer, the second pixel definition layer includes a plurality of second openings, an orthographic projection of at least one second opening onto the light-emitting substrate covers an orthographic projection of a corresponding first opening onto the light-emitting substrate, and the second wavelength conversion patterns are filled in the second openings.

In a possible embodiment of the present disclosure, the display panel includes a color film layer arranged on a side of the second wavelength conversion layer away from the first wavelength conversion layer, and the color film layer includes a plurality of color filters corresponding to the pixels respectively. The plurality of color filters includes a red color filter that only allows red light to pass therethrough, a green color filter that only allows green light to pass therethrough, and a blue color filter that only allows blue light to pass therethrough.

In a possible embodiment of the present disclosure, the display panel further includes a black matrix arranged on a side of the second pixel definition layer away from the encapsulation layer. The black matrix has a plurality of third openings corresponding to the pixels, an orthographic projection of at least one third opening onto the light-emitting substrate substantially coincides with an orthographic projection of a corresponding second opening onto the light-emitting substrate, and the color filters are arranged in the third openings.

In a possible embodiment of the present disclosure, the second wavelength conversion layer is a quantum dot film layer.

In a possible embodiment of the present disclosure, the light-emitting structure further includes an anode and a cathode arranged opposite to each other, the first light-emitting layer and the second light-emitting layer are arranged between the anode and the cathode. In a same light-emitting structure, a charge generation layer is provided between the first light-emitting layer and the second light-emitting layer, and the first light-emitting layer and the second light-emitting layer share the anode and the cathode.

Embodiments of the present disclosure further provide a display device including the above-mentioned display panel.

Embodiments of the present disclosure further provide a method for manufacturing a display panel, including:

forming a light-emitting substrate including a plurality of light-emitting structures, where at least one light-emitting structure includes one or more first light-emitting layers emitting a first waveband light and one or more second light-emitting layers emitting a second waveband light laminated one on another, and a wavelength of the first waveband light is smaller than a wavelength of the second waveband light;

forming a plurality of first wavelength conversion layers corresponding to the light-emitting structures at a light-exiting side of the light-emitting substrate, the first wavelength conversion patterns being arranged at the light-exiting side of at least part of the light-emitting structures; and forming a second wavelength conversion layer having a plurality of second wavelength conversion patterns on a side of the first wavelength conversion layer away from the light-emitting substrate.

In a possible embodiment of the present disclosure, the forming a plurality of first wavelength conversion layers corresponding to the light-emitting structures at a light-exiting side of the light-emitting substrate, includes:

forming a first inorganic encapsulation layer at the light-exiting side of the light-emitting structures;

printing a first ink at the light-exiting side of at least part of the light-emitting structures to form the first wavelength conversion patterns;

printing a second ink on a side of the first wavelength conversion pattern away from the first inorganic encapsulation layer to form an organic encapsulation layer; and forming a second inorganic encapsulation layer on a side of the organic encapsulation layer away from the first wavelength conversion pattern.

In a possible embodiment of the present disclosure, the printing a first ink at the light-exiting side of at least part of the light-emitting structures, includes:

printing the second ink containing luminescent particles at the light-exiting side of at least part of the light-emitting structures.

DETAILED DESCRIPTION

Figure 1:
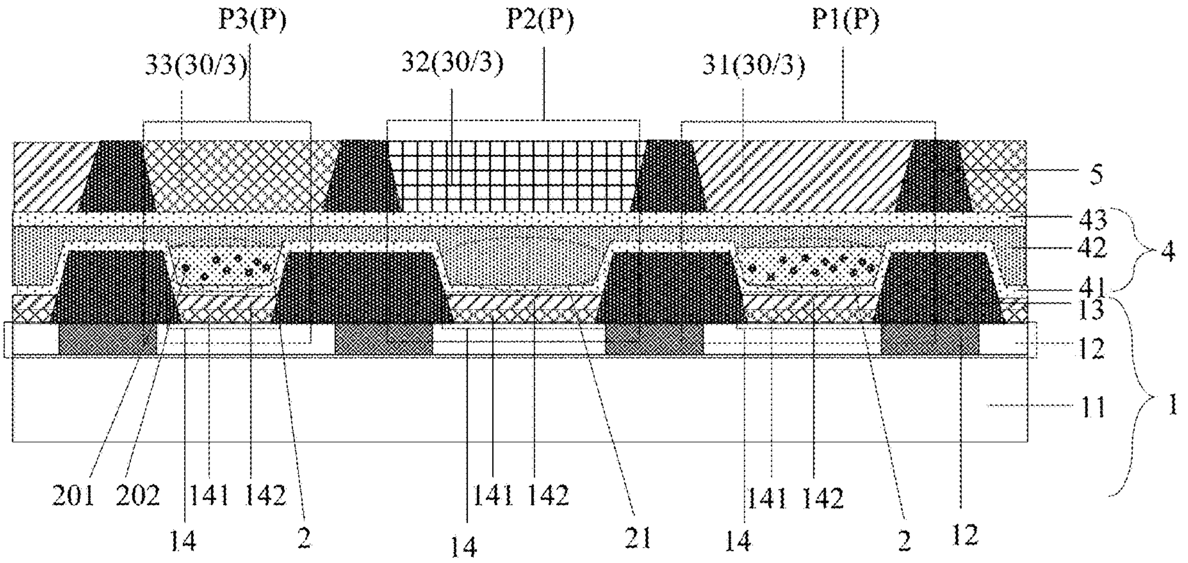
FIG. 1 is a first schematic view showing a display panel according to the embodiments of the present disclosure.

In order to make the objects, the technical solutions and the advantages of the present disclosure more apparent, the present disclosure will be described hereinafter in a clear and complete manner in conjunction with the drawings and embodiments. Apparently, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In order to keep the following illustration of the embodiments of the present disclosure clear and concise, detailed descriptions of known functions and known components are omitted in the present disclosure.

The technology of combining blue organic light emitting diode (OLED) display with quantum dot QD is called QD-OLED, QD-OLED has the advantages of high color gamut and so on, but the main technical challenges are the performance/service life bottlenecks of blue OLED devices, QD quantum dots having low light conversion efficiency, resulting in low overall brightness of the device, R, G, B brightness cannot reach the optimal ratio of 3:6:1.

In view of this, embodiments of the present disclosure provide a display panel having a plurality of pixels P, and the display panel includes a light-emitting substrate 1, a first wavelength conversion layer and a second wavelength conversion layer 3.

The light-emitting substrate 1 includes a plurality of light-emitting structures 14 corresponding to pixels P respectively, at least one light-emitting structure 14 includes one or more first light-emitting layers 141 emitting a first waveband light and one or more second light-emitting layers 142 emitting a second waveband light laminated one on another, and a wavelength of the first waveband light is smaller than a wavelength of the second waveband light. Specifically, for example, the first waveband light may be blue light, and the first light-emitting layer 141 may be a light-emitting layer emitting blue light.

The first wavelength conversion layer has a plurality of first wavelength conversion patterns 2 corresponding to the light-emitting structures 14, the first wavelength conversion patterns 2 are arranged at a light-exiting side of at least part of the light-emitting structures 14 and configured to perform up-conversion on the second waveband light emitted by the second light-emitting layer 142. Specifically, for example, the first wavelength conversion patterns 2 may convert the light emitted by the second light-emitting layer 142 into blue light.

The second wavelength conversion layer 3 is arranged on a side of the first wavelength conversion layer away from the light-emitting substrate 1, has a plurality of second wavelength conversion patterns 30 corresponding to the light-emitting structures 14, and the second wavelength conversion patterns 30 are configured to perform down-conversion on light emitted through the first wavelength conversion layer. Specifically, the plurality of second wavelength conversion patterns 30 may include a red second wavelength conversion pattern 31 that absorbs blue light and allows red light to exit therethrough, a green second wavelength conversion pattern 32 that absorbs blue light and allows green light to exit therethrough, and a blue second wavelength conversion pattern 33 that allows blue light to pass therethrough. Specifically, the second wavelength conversion layer 3 may be a quantum dot film layer.

In the embodiments of the present disclosure, the light-emitting structure 14 of the light-emitting substrate 1 includes one or more first light-emitting layers 141 emitting a first waveband light and one or more second light-emitting layers 142 emitting a second waveband light, the first wavelength conversion patterns 2 are arranged at the light-exiting side of at least part of the light-emitting structure 14, and the light emitted by the second light-emitting layer 142 may exit though or converted by the first wavelength conversion layer, thereby enhancing the light emitting brightness of the pixel and mitigating the problem of low overall brightness of the QD-OLED display panel.

In a possible embodiment of the present disclosure, as shown in FIG. 1, the plurality of pixels P includes a red pixel P1 emitting red light, a green pixel P2 emitting green light, and a blue pixel P3 emitting blue light. The first light-emitting layer 141 emits blue light, the second light-emitting layer 142 emits green light, and the first wavelength conversion patterns 2 are arranged at the light-exiting side of the light-emitting structure 14 corresponding to the red pixel P1 and the blue pixel P3. That is, the first wavelength conversion pattern 2 is not arranged corresponding to the green pixel P2.

In the embodiments of the present disclosure, the first light-emitting layer 141 emits blue light, the second light-emitting layer 142 emits green light, and the first wavelength conversion patterns 2 are arranged at the light-exiting side of the light-emitting structure 14 corresponding to the red pixel P1 and the blue pixel P3. Thus, with regard to the green pixel P2, the blue light originally emitted by the first light-emitting layer 141 may be converted into green light via the green second wavelength conversion pattern 32, and the green light emitted by the second light-emitting layer 142 may directly exit, so as to directly enhance the light intensity of the green pixel P2. With regard to the red pixel P1, the blue light originally emitted by first light-emitting layer 141 may be converted into red light via the red second wavelength conversion pattern 31, and the green light emitted by the second light-emitting layer 142 may be converted into blue light via the first wavelength conversion pattern 2, and the converted blue light excites the red second wavelength conversion pattern 31 to enable the blue light to be converted into red light, so as to enhance the light-emitting brightness of the red pixel P1. With regard to the blue pixel P3, blue light originally emitted by first light-emitting layer 141 may pass through the blue second wavelength conversion pattern 33 and then exit through the blue second wavelength conversion pattern, and the green light emitted by the second light-emitting layer 142 may be converted into blue light through the first wavelength conversion pattern 2, and the converted blue light may pass through the blue second wavelength conversion pattern 33 and then exit through the blue second wavelength conversion pattern, so as to enhance the light intensity of the blue pixel P3.

Figure 2:
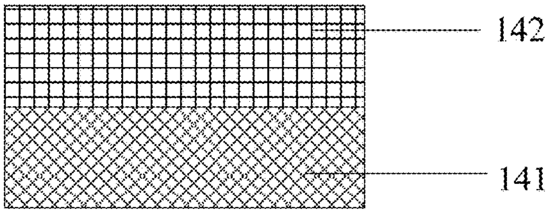
FIG. 2 is a schematic view showing a light-emitting structure according to the embodiments of the present disclosure.

In a possible embodiment of the present disclosure, with reference to FIG. 2, the light-emitting structure 14 includes one first light-emitting layer 141 and one second light-emitting layer 142. During the implementation, the second light-emitting layer 142 may be arranged on a side of the first light-emitting layer 141 facing the first wavelength conversion pattern 2, or the second light-emitting layer 142 may be arranged on a side of the first light-emitting layer 141 away from the first wavelength conversion pattern 2.

Figure 3:
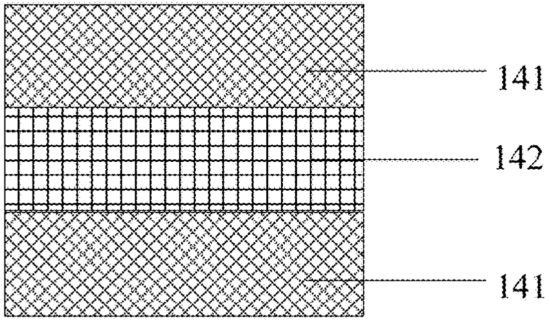
FIG. 3 is another schematic view showing the light-emitting structure according to the embodiments of the present disclosure.

In a possible embodiment of the present disclosure, with reference to FIG. 3, the light-emitting structure 14 includes two first light-emitting layers 141 and one second light-emitting layer 142, the second light-emitting layer 142 being arranged between the two first light-emitting layers 141.

In a possible embodiment of the present disclosure, the two first light-emitting layers 141 are made of a same light-emitting layer material. In the embodiments of the present disclosure, since the two first light-emitting layers 141 are made of the same light-emitting layer material, a stacked spectrum may be made narrow, so as to avoid the problem that the stacked spectrum is broadened due to that there are different emission peaks in the case of different materials.

In a possible embodiment of the present disclosure, a first wavelength conversion pattern 2 of the red pixel P1 may be made of a material different from a first wavelength conversion pattern 2 of the green pixel P2. Specifically, for example, a material contained in the first wavelength conversion pattern 2 of the blue pixel P3 can convert light of other wavebands in the backlight into blue light of 450 nm-460 nm, which exits directly, so as to meet the requirement on an optimal light waveband of the blue pixel in the current industry, while a material contained in the first wavelength conversion pattern 2 of the red pixel P1 may be specifically set with respect to a wavelength range corresponding to an optimal value of the absorption conversion rate of the red second wavelength conversion pattern 31. Namely, the wavelength range corresponding to the optimal value of the absorption conversion rate of the red second wavelength conversion pattern 31 may be different from an optimal light wavelength band of the blue pixel required in the current industry.

Figure 4:
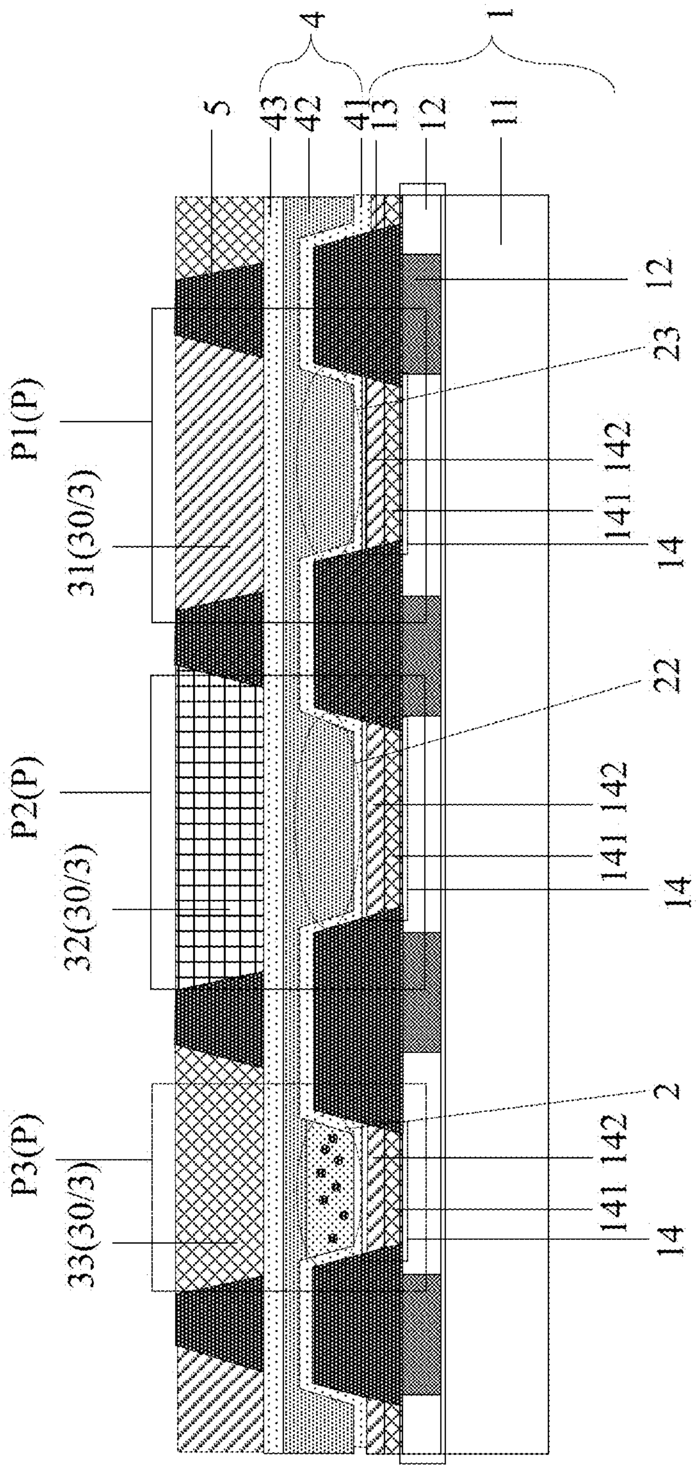
FIG. 4 is another schematic view showing the display panel according to the embodiments of the present disclosure.

In a possible embodiment of the present disclosure, with reference to FIG. 4, the plurality of pixels P includes a red pixel P1 emitting red light, a green pixel P2 emitting green light, and a blue pixel P3 emitting blue light.

The first light-emitting layer 141 emits blue light, the second light-emitting layer 142 emits yellow light, and the first wavelength conversion patterns 2 are arranged at the light-exiting side of the light-emitting structure 14 corresponding to blue pixels P3.

In the embodiments of the present disclosure, the second light-emitting layer 142 emits yellow light, and the first wavelength conversion pattern 2 is arranged at the light-exiting side of the light-emitting structure 14 of the blue pixel P3. Thus, with regard to the blue pixel P3, blue light originally emitted by the first light-emitting layer 141 may pass through the blue second wavelength conversion pattern 33 and then exit through the blue second wavelength conversion pattern, and the yellow light emitted by the second light-emitting layer 142 may be converted into blue light through the first wavelength conversion pattern 2, and the converted blue light passes through the blue second wavelength conversion pattern 33 and then exit through the blue second wavelength conversion pattern, so as to enhance the light-emitting brightness of the blue pixel P3. With regard to the green pixel P2, the blue light originally emitted by the first light-emitting layer 141 may be converted into green light via the green second wavelength conversion pattern 32, and the yellow light (which can be understood to be a combination of red light and green light) emitted by the second light-emitting layer 142 may pass through the green second wavelength conversion pattern 32 and is filtered into green light via the green color filter of the pixel subsequently, so as to enhance the light-emitting brightness of the green pixel P2. With regard to the red pixel P1, the blue light originally emitted by first light-emitting layer 141 may be converted into red light via the red second wavelength conversion pattern 31, and the yellow light (which can be understood to be a combination of red light and green light) emitted by the second light-emitting layer 142 may pass through the red second wavelength conversion pattern 31 and is filtered into red light via the red color filter of the pixel subsequently, so as to enhance the light-emitting brightness of the red pixel P1.

During the implementation, the second light-emitting layer 142 may be arranged on the side of the first light-emitting layer 141 facing the first wavelength conversion pattern 2, or the second light-emitting layer 142 may be arranged on the side of the first light-emitting layer 141 away from the first wavelength conversion pattern 2.

Figure 5:
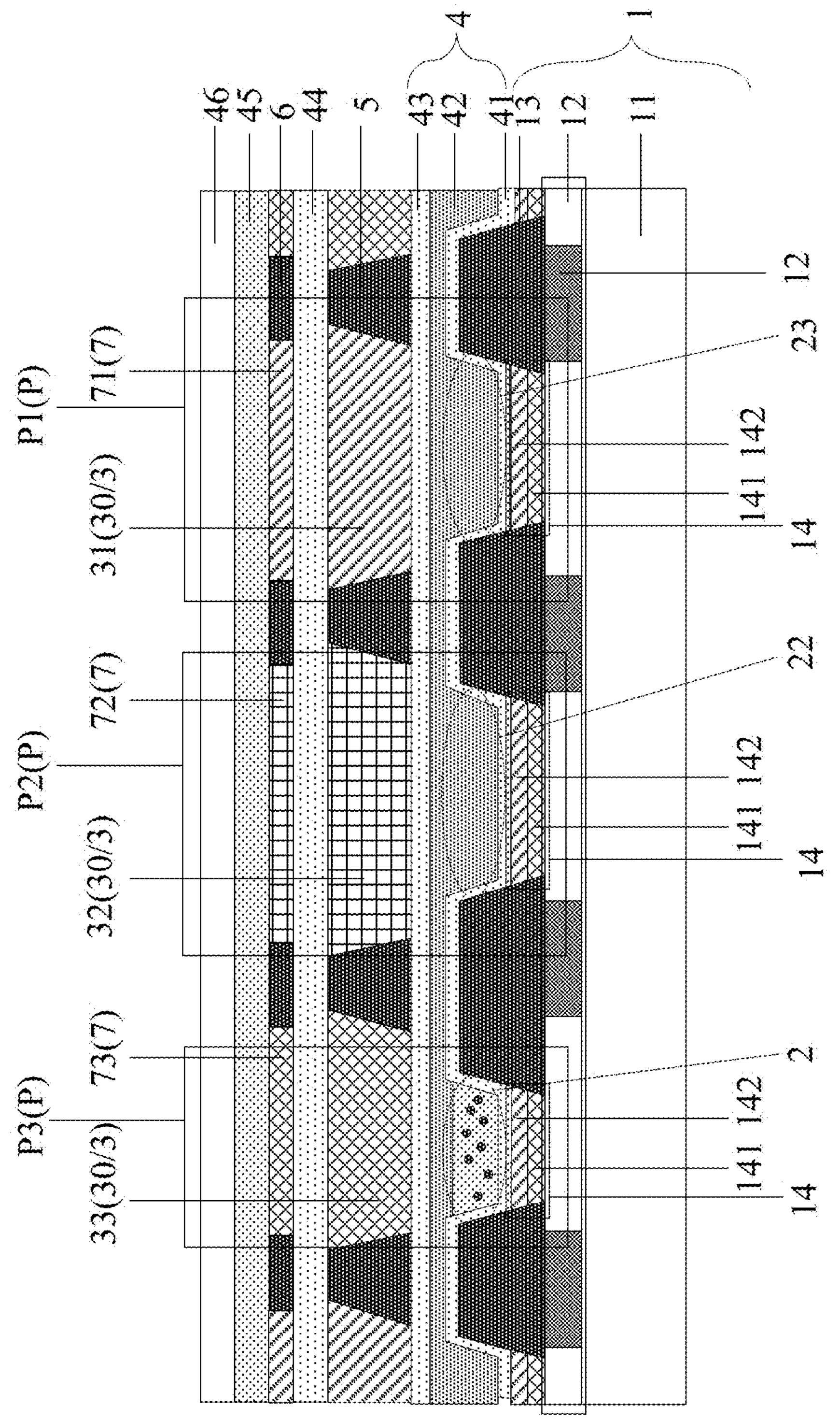
FIG. 5 is yet another schematic view showing the display panel according to the embodiments of the present disclosure.

In a possible embodiment of the present disclosure, as shown in FIG. 1, FIG. 4 or FIG. 5, the display panel includes an encapsulation layer 4 arranged between the light-emitting substrate 1 and the second wavelength conversion layer 3, the encapsulation layer 4 includes a first inorganic encapsulation layer 41, an organic encapsulation layer 42 arranged on a side of the first inorganic encapsulation layer 41 away from the light-emitting substrate 1, and a second inorganic encapsulation layer 43 arranged on a side of the organic encapsulation layer 42 away from the first inorganic encapsulation layer 41. The first wavelength conversion patterns 2 are arranged between the first inorganic encapsulation layer 41 and the organic encapsulation layer 42. In the embodiments of the present disclosure, the first wavelength conversion patterns 2 are arranged between the first inorganic encapsulation layer 41 and the organic encapsulation layer 42, and when the organic encapsulation layer 42 is formed by inkjet printing, the material of the first wavelength conversion patterns 2 may be mixed in a printing ink for printing, so as to achieve compatibility with the current process of forming the encapsulation layer 4, thereby to simplify the manufacturing process of the display panel.

In a possible embodiment of the present disclosure, when the first wavelength conversion patterns 2 are arranged at the light-exiting side of the light-emitting structure 14 of the red pixel P1 and the blue pixel P3, namely, in conjunction with FIG. 1, the organic encapsulation layer 42 includes a first filling part 21 filled in the green pixel P2, and the first filling part 21 has approximately a same thickness as the first wavelength conversion patterns 2. In this way, the pixels P may have a uniform thickness, thereby facilitating subsequent fabrication of the second inorganic encapsulation layer 43.

In a possible embodiment of the present disclosure, when the first wavelength conversion patterns 2 are arranged at the light-exiting side of the light-emitting structures 14 of the blue pixels P3, as shown in FIG. 4, the organic encapsulation layer 42 includes a second filling part 22 filled in the green pixel P2 and a third filling part 23 filled in the red pixel P1. The second filling part 22 and the third filling part 23 have substantially a same thickness as the first wavelength conversion patterns 2, so that the pixels P may have a uniform thickness, thereby facilitating the subsequent fabrication of the second inorganic encapsulation layer 43.

In the embodiment of the present disclosure, when forming the first wavelength conversion patterns 2, the material of the first wavelength conversion patterns 2 may be mixed in the ink for ink-jet printing, so as to achieve patterning through printing. The first wavelength conversion patterns 2 are formed in an ultraviolet curing manner, and then an ink for ink-jet printing is printed in an entire surface manner, so as to fill the pixels which are not provided with the first wavelength conversion patterns 2, thereby to achieve planarization.

Specifically, the thickness of the first wavelength conversion pattern 2 may be 1 μm to 3 μm.

Figure 6:
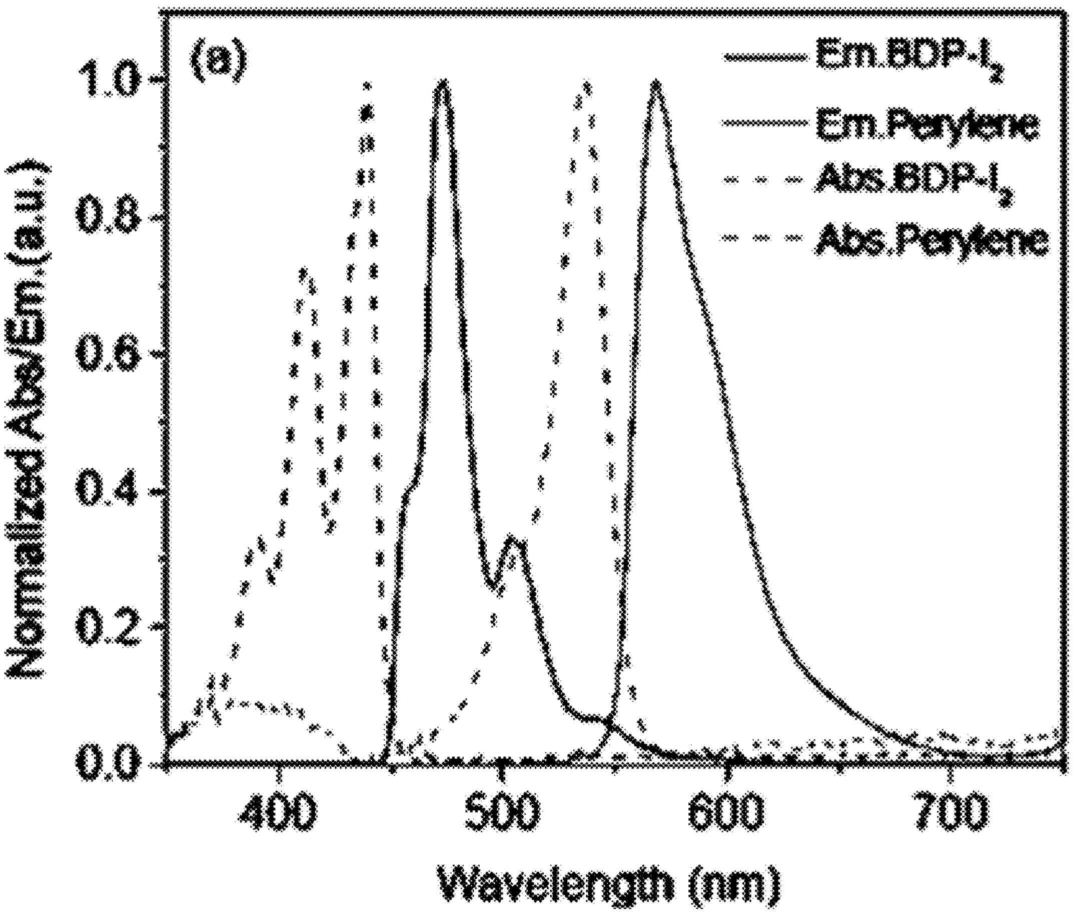
FIG. 6 is a schematic diagram of absorption and luminescence curves of luminescent particles according to the embodiments of the present disclosure.

In a possible embodiment of the present disclosure, as shown in FIG. 1, the first wavelength conversion pattern 2 includes a base 201 and luminescent particles 202 dispersed in the base 201, a material of the luminescent particles 202 may be a rare earth material, and the material of the luminescent particles 202 includes: a sulfate, and at least one of Sc, Y, La, Gd or Lu dispersed in the sulfate. In specific, the luminescent particles 202 may further include a small amount of activator Me, Me being a trivalent cation, typically Bi3+, Pr3+, and Nd3+. Specifically, the absorption and emission curves of triplet-triplet annihilation materials may be shown in FIG. 6. FIG. 6 shows a BDP-$I_2$ emission spectrum, a perylene emission spectrum, a BDP-$I_2$ absorption spectrum, and a perylene absorption spectrum.

In specific, the first wavelength conversion pattern 2 may be implemented in three ways. For example, it may be implemented in a manner of an up-conversion material based on triplet-tripletannihilation (TTA). For another example, it may be implemented in a manner of two-photon up-conversion by using dyes with relatively large two-photon absorption section. For another example, it may be implemented in a manner of an up-conversion with a light wave frequency by using a rare earth material or the like. In the embodiments of the present disclosure, it may be preferably implemented in a manner of meeting the requirement on conversion waveband and being capable of improving efficiency.

In a possible embodiment of the present disclosure, the base 201 may be made of a same material as the organic encapsulation layer 42.

In a possible embodiment of the present disclosure, in conjunction with FIG. 1, FIG. 4, or FIG. 5, the display panel further includes: a first pixel definition layer 13, wherein the first pixel definition layer 13 has a plurality of first openings corresponding to the pixels P respectively, and the first wavelength conversion patterns 2 are arranged at the first openings.

In a possible embodiment of the present disclosure, in conjunction with FIG. 1, FIG. 4, or FIG. 5, the display panel further includes: a second pixel definition layer 5, wherein the second pixel definition layer 5 includes a plurality of second openings, and the orthographic projection of at least one second opening onto the light-emitting substrate 1 covers an orthographic projection of a corresponding first opening onto the light-emitting substrate 1. The second wavelength conversion patterns 30 are filled in the second openings.

Figure 7:
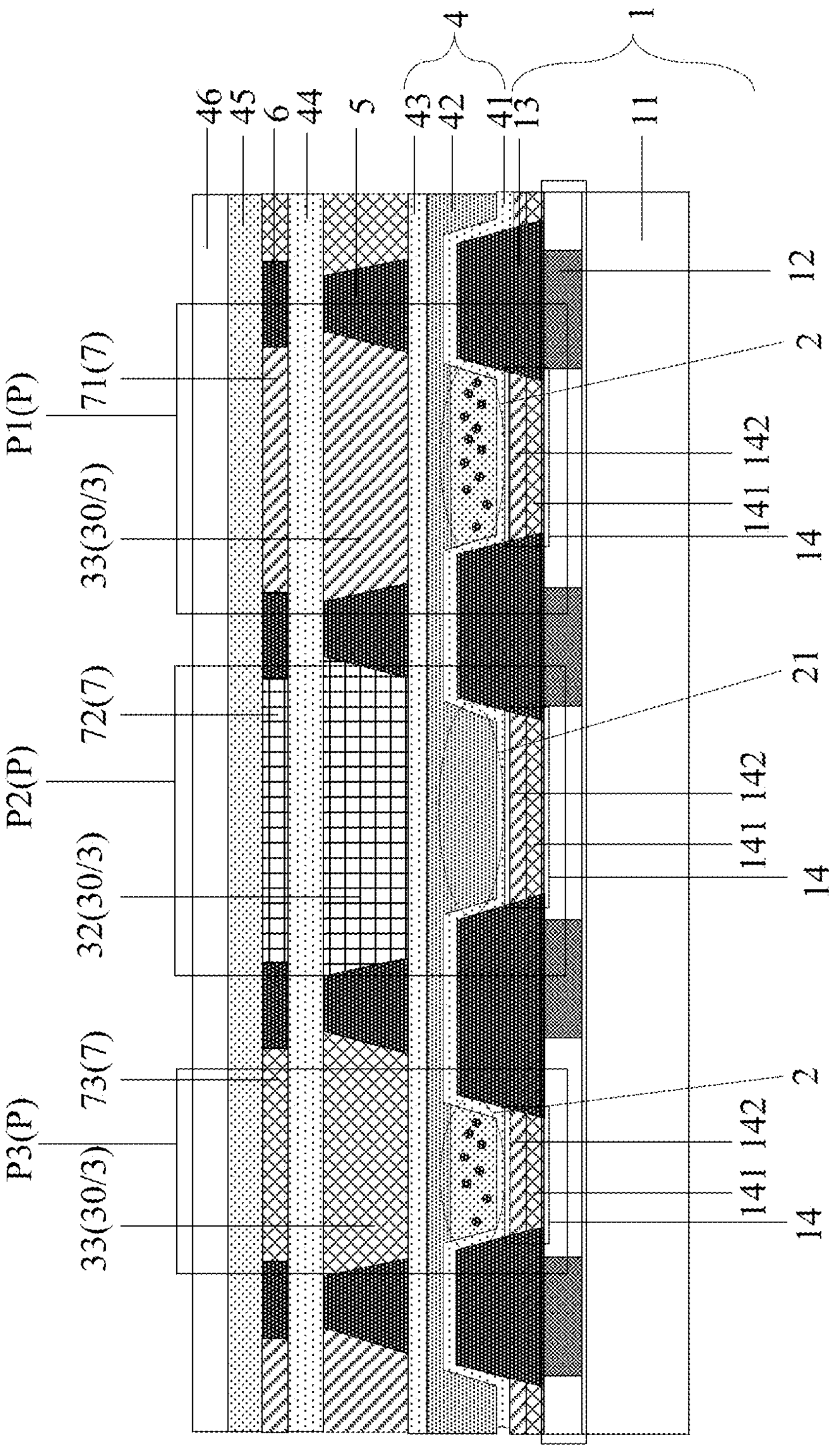
FIG. 7 is still yet another schematic view showing the display panel according to the embodiments of the present disclosure.

In a possible embodiment of the present disclosure, in conjunction with FIGS. 5 and 7, the display panel includes a color film layer 7 arranged on a side of the second wavelength conversion layer 3 away from the first wavelength conversion layer 2, and the color film layer 7 includes a plurality of color filters corresponding to the pixels P respectively. The plurality of color filters includes a red color filter 71 that only allows red light to pass therethrough, a green color filter 72 that only allows green light to pass therethrough, and a blue color filter 73 that only allows blue light to pass therethrough. The red color filter 71 corresponds to the red pixel P1, the green color filter 72 corresponds to the green pixel P2, and the blue color filter 73 corresponds to the blue pixel P3. Specifically, when the second light-emitting layer 142 emits yellow light, the yellow light emitted by the second light-emitting layer 142 is filtered by the red color filter 71 and then red light exits from the red color filter 71, and the yellow light emitted by the second light-emitting layer 142 is filtered by the green color filter 72 and then green light exits from the green color filter 72.

The display panel further includes a black matrix 6 arranged on the side of the second pixel definition layer 5 away from the encapsulation layer 4. The black matrix 6 has a plurality of third openings corresponding to the pixels P, an orthographic projection of at least one third opening onto the light-emitting substrate 1 substantially coincides with an orthographic projection of a corresponding second opening onto the light-emitting substrate 1, and the color filters are arranged in the third openings. The orthographic projection of the third opening onto the light-emitting substrate 1 substantially coincides with the orthographic projection of the corresponding second opening onto the light-emitting substrate 1, and it may be understood that an overlapping area between the two is 90%-110%.

During the implementation, in conjunction with FIG. 1, FIG. 4, FIG. 5 or FIG. 7, the light-emitting substrate 1 may include a base substrate 11, and a thin film transistor 12 arranged between the base substrate 11 and the light-emitting structure 14. The display panel further includes a quantum dot encapsulation layer 44 arranged between the second wavelength conversion layer 3 and the color film layer 7, and a reflective polarizer 45 arranged on a side of the color film layer 7 away from the second wavelength conversion layer 3, and a protective layer 46 arranged on a side of the reflective polarizer 45 away from the color film layer 7.

Figure 13:
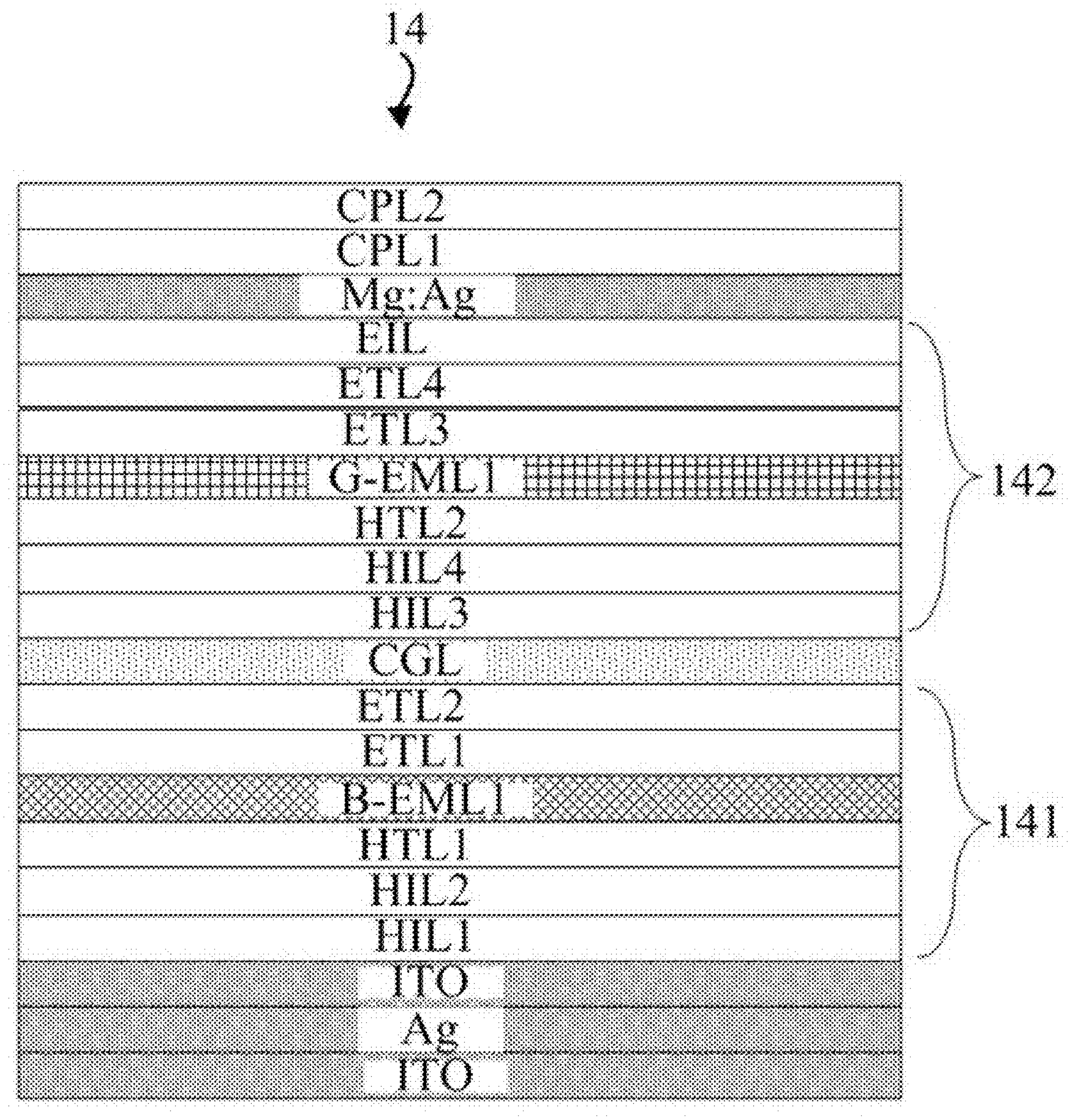
FIG. 13 is a schematic view showing a light-emitting structure according to the embodiments of the present disclosure.

In a possible embodiment of the present disclosure, as shown in FIG. 13, the light-emitting structure 14 further includes: an anode (e.g., which may include ITO/Ag/ITO laminated one on another) and a cathode (e.g., which may include Mg:Ag) arranged opposite to each other. In specific, the cathode may be arranged on a side of the anode facing the first light-converting layer. The first light-emitting layer 141 and the second light-emitting layer 142 are arranged between the anode and the cathode. In a same light-emitting structure 14, a charge generation layer CGL is provided between the first light-emitting layer 141 and the second light-emitting layer 142, and the first light-emitting layer 41 and the second light-emitting layer 142 share the anode and the cathode. The charge generation layer is electrically connected to the first light-emitting layer 141 and the second light-emitting layer 142, so as to apply a voltage to the first light-emitting layer 141 and the second light-emitting layer 142.

Specifically, a case where the light-emitting structure 14 includes one first light-emitting layer 141 and one second light-emitting layer 142, the first light-emitting layer 141 emits blue light and the second light-emitting layer 142 emits green light is taken as an example, and as shown in FIG. 13, between the anode and the charge generation layer CGL, a first hole injection layer HIL1, a second hole injection layer HIL2, a first hole transport layer HTL1, a blue organic light-emitting layer B-EML1, a first electron transport layer ETL1 and a second electron transport layer ETL2 are laminated one on another sequentially. Between the charge generation layer CGL and the cathode, a third hole injection layer HIL3, a fourth hole injection layer HIL4, a second hole transport layer HTL2, a green organic light-emitting layer G-EML2, a third electron transport layer ETL3, a fourth electron transport layer ETL4 and an electron injection layer EIL are laminated one on another sequentially. The first hole injection layer HIL1, the second hole injection layer HIL2, the first hole transport layer HTL1, the blue organic light-emitting layer B-EML1, the first electron transport layer ETL1 and the second electron transport layer ETL2 form the first light-emitting layer 141. The third hole injection layer HIL3, the fourth hole injection layer HIL4, the second hole transport layer HTL2, the green organic light-emitting layer G-EML2, the third electron transport layer ETL3, the fourth electron transport layer ETL4 and the electron injection layer EIL form the second light-emitting layer 142.

Embodiments of the present disclosure further provide a display device including the above-mentioned display panel.

Figure 8:
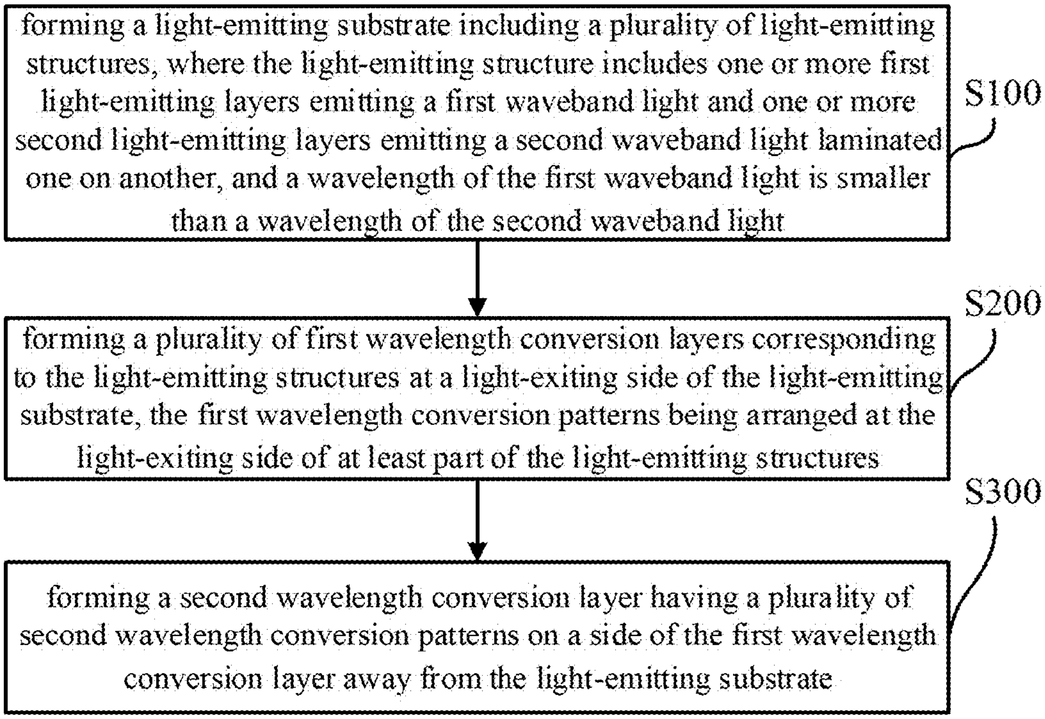
FIG. 8 is a flow chart illustrating a process for manufacturing a display panel according to the embodiments of the present disclosure.

Referring to FIG. 8, embodiments of the present disclosure further provide a method for manufacturing a display panel, including:

at step S100, forming a light-emitting substrate including a plurality of light-emitting structures, where the light-emitting structure includes one or more first light-emitting layers emitting a first waveband light and one or more second light-emitting layers emitting a second waveband light laminated one on another, and a wavelength of the first waveband light is smaller than a wavelength of the second waveband light;

at step S200, forming a plurality of first wavelength conversion layers corresponding to the light-emitting structures at a light-exiting side of the light-emitting substrate, the first wavelength conversion patterns being arranged at the light-exiting side of at least part of the light-emitting structures; and at step S300, forming a second wavelength conversion layer having a plurality of second wavelength conversion patterns on a side of the first wavelength conversion layer away from the light-emitting substrate.

Figure 9:
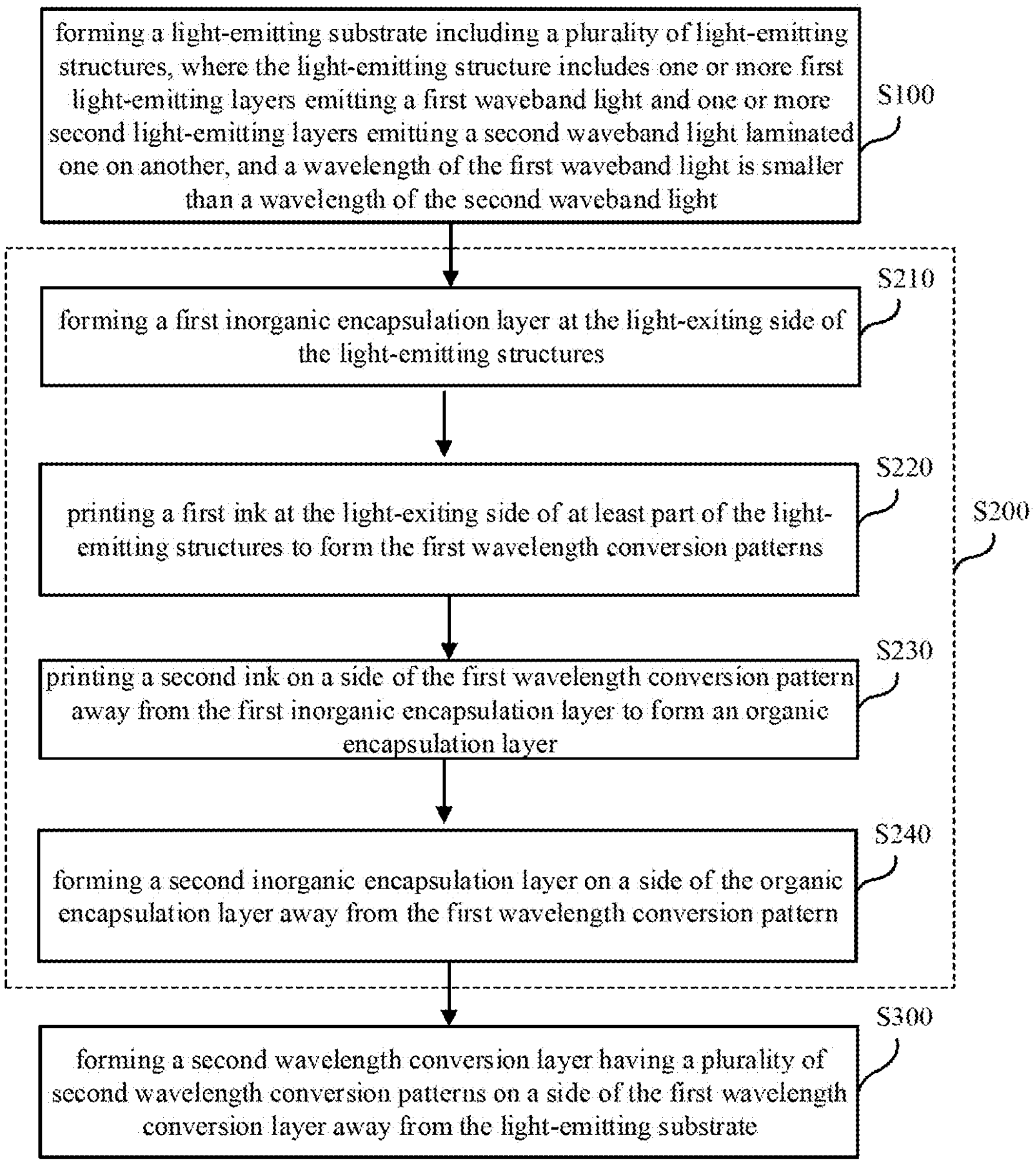
FIG. 9 is another flow chart illustrating the process for manufacturing the display panel according to the embodiments of the present disclosure.

In a possible embodiment of the present disclosure, see FIG. 9, regarding step S200, the forming a plurality of first wavelength conversion layers corresponding to the light-emitting structures at a light-exiting side of the light-emitting substrate, includes:

at step S210, forming a first inorganic encapsulation layer at the light-exiting side of the light-emitting structures;

at step S220, printing a first ink at the light-exiting side of at least part of the light-emitting structures to form the first wavelength conversion patterns;

at step S230, printing a second ink on a side of the first wavelength conversion pattern away from the first inorganic encapsulation layer to form an organic encapsulation layer; and at step S240, forming a second inorganic encapsulation layer on a side of the organic encapsulation layer away from the first wavelength conversion pattern.

In a possible embodiment of the present disclosure, the plurality of pixels includes a red pixel that emits red light, a green pixel that emits green light, and a blue pixel that emits blue light. With regard to step S220, the printing a first ink at the light-exiting side of at least part of the light-emitting structures, includes;

printing the second ink containing luminescent particles at the light-exiting side of at least part of the light-emitting structures.

In order to more clearly understand the method for manufacturing the display panel in the embodiments of the present disclosure, a case where the first light-emitting layer 141 of the light-emitting structure 14 emits blue light and the second light-emitting layer 142 of the light-emitting structure 14 emits green light is taken as an example, a further explanation is given as follows in conjunction with FIGS. 10-18.

Figure 10:
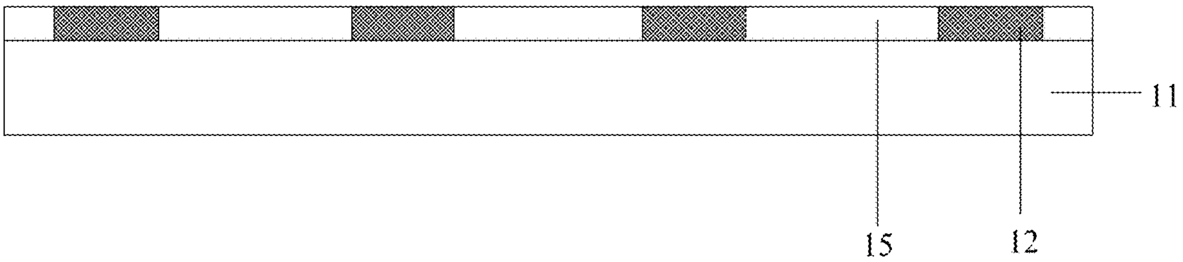
FIG. 10 is a schematic view showing forming a thin film transistor according to the embodiments of the present disclosure.

In step one, the thin film transistor 12 for driving the light-emitting structure 14 to emit light and a reflective anode 15 are formed on one side of the base substrate 11, as shown in FIG. 10. Specifically, the base substrate 11 including the thin film transistor 12 may be an oxide thin film transistor array substrate (Oxide TFT) or a Low Temperature Poly-Silicon (LTPS) substrate.

Figure 11:
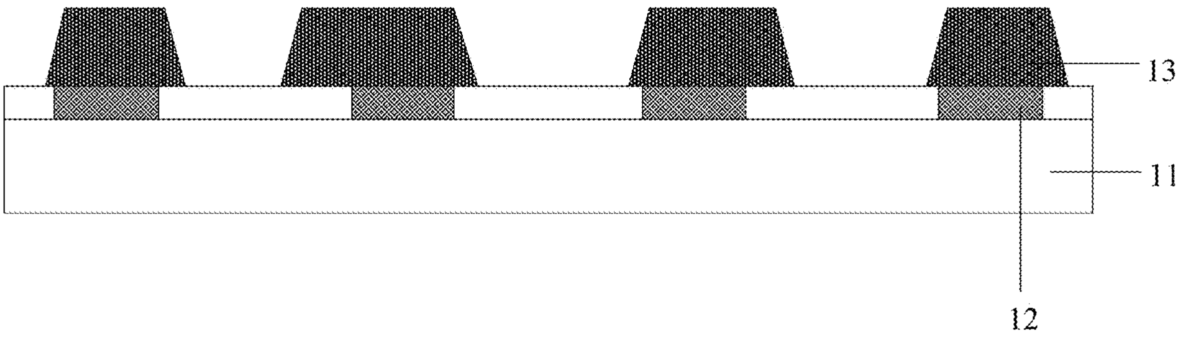
FIG. 11 is a schematic view showing forming a first pixel definition layer according to the embodiments of the present disclosure.

In step two, the first pixel definition layer 13 is formed, as shown in FIG. 11. The first pixel definition layer 13 is colored or transparent (preferably colored, more preferably black) and areas of pixels defined by the first pixel definition layer 13 may be an area of green pixel G≥an area of red pixel R≥an area of blue pixel B. The first pixel definition layer 13 may have a thickness between 2 μm and 4 μm. The base substrate 11 is a rigid glass or plastic base material.

Figure 12:
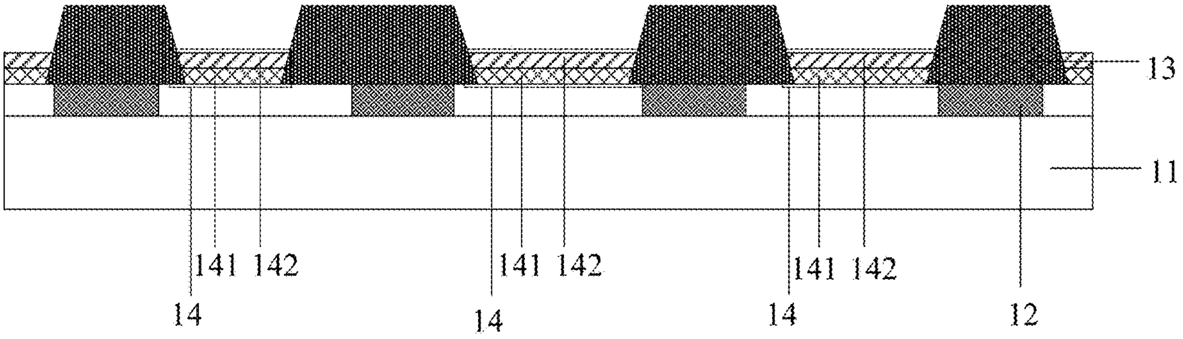
FIG. 12 is a schematic view showing forming a light-emitting structure according to the embodiments of the present disclosure.

In step three, film layers of the light-emitting structure 14 are deposited in a more economical manner through an open mask. For example, light-emitting structure 14 is an OLED device. As shown in FIG. 12, the light-emitting structure 14 includes the first light-emitting layer 141 and the second light-emitting layer 142 arranged in a laminated manner.

In some exemplary embodiments, as shown in FIG. 13, the light-emitting structure 14 includes an anode (ITO/Ag/ITO), a first hole injection layer HIL1, a second hole injection layer HIL2, a first hole transport layer HTL1, a blue organic light-emitting layer B-EML1, a first electron transport layer ETL1, a second electron transport layer ETL2, a charge generation layer CGL, a third hole injection layer HIL3, a fourth hole injection layer HIL4, a second hole transport layer HTL2, a green organic light-emitting layer G-EML2, a third electron transport layer ETL3, a fourth electron transport layer ETL4, an electron injection layer EIL, and a cathode (Mg:Ag, specifically, the cathode may be formed by co-evaporating Mg and Ag), a first light extraction layer CPL1 and a second light extraction layer CPL2. The first hole injection layer HIL1, the second hole injection layer HIL2, the first hole transport layer HTL1, the blue organic light-emitting layer B-EML1, the first electron transport layer ETL1 and the second electron transport layer ETL2 form the first light-emitting layer 141, the third hole injection layer HIL3, the fourth hole injection layer HIL4, the second hole transport layer HTL2, the green organic light-emitting layer G-EML2, the third electron transport layer ETL3, the fourth electron transport layer ETL4 and the electron injection layer EIL form the second light-emitting layer 142. The charge generation layer (CGL) is electrically connected to the first light-emitting layer 141 and the second light-emitting layer 142, so as to apply a voltage to the first light-emitting layer 141 and the second light-emitting layer 142, thereby to enable the first light-emitting layer 141 and the second light-emitting layer 142 to emit light. A total thickness of two stacked layers of the first light-emitting layer 141 and the second light-emitting layer 142 may be approximately 300 nm.

Note that, for convenience of illustration, film layer structures other than the first light-emitting layer 141 and the second light-emitting layer 142 are not shown in FIG. 1, FIGS. 4 to 5, FIG. 7, FIG. 12, and FIGS. 14 to 19, it does not mean that necessary functional film layers in FIG. 13 are omitted in an actual structure.

Figure 14:
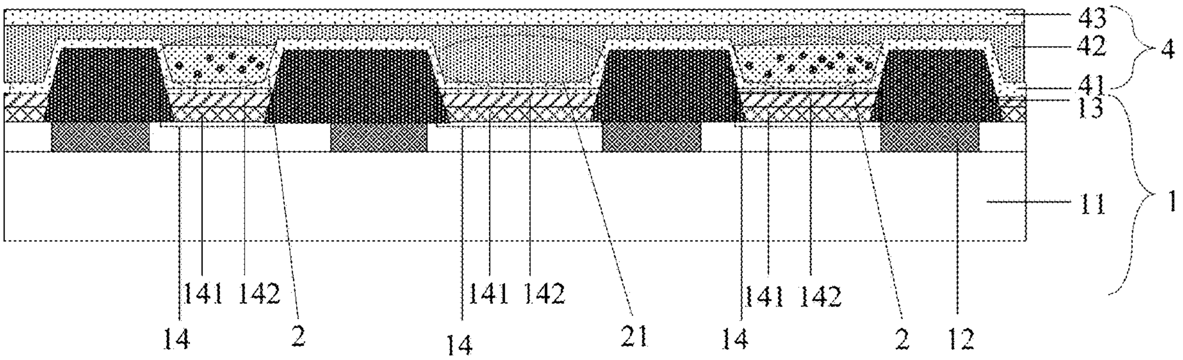
FIG. 14 is a schematic view showing forming an encapsulation layer according to the embodiments of the present disclosure.

In step four, the encapsulation layer 4 is formed at the light-exiting side of the light-emitting structure 14, as shown in FIG. 14. Specifically, a first inorganic film layer may be deposited through a chemical vapor deposition method, and serves as the first inorganic encapsulation layer 41. For example, a SiON or SiN dense thin film may be deposited by using an open mask, with a thickness being smaller than 1 μm. An up-conversion material is printed on the first inorganic encapsulation layer 41 at positions corresponding to the blue pixel B and the red pixel R, where the up-conversion material may be a triplet-tripletannihilation (TTA)-based up-conversion material. Alternatively, it may be implemented in a manner of an up-conversion with a light wave frequency by using a rare earth material or the like, which can absorb light of 485 nm to 588 nm and convert same into blue light of 380 nm to 484 nm. The up-conversion material may be mixed in an Ink-jet Printing (IJP) ink, so as to realize patterning through printing. UV curing is used to form the up-conversion layer with a thickness of 1 μm to 3 μm which serves as the first wavelength conversion pattern 2. Next, an ink-jet printing ink is printed in an entire surface, and the green pixel G is filled, so as to realize planarization. A total thickness of the first wavelength conversion pattern 2 and the organic encapsulation layer 42 is 6 μm to 8 μm. Next, a SiON or SiN dense thin film is deposited on the organic encapsulation layer 42 by using an open mask through chemical vapor deposition, so as to form the second inorganic encapsulation layer 43 having a thickness of smaller than 1 μm.

Figure 15:
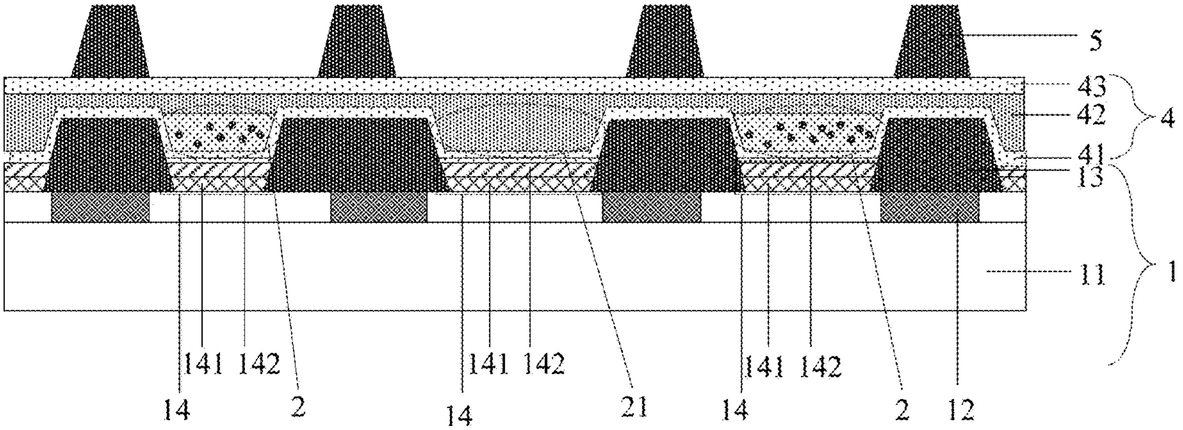
FIG. 15 is a schematic view showing forming a second pixel definition layer according to the embodiments of the present disclosure.

Step five, a patterned second pixel definition layer 5 is formed on the encapsulation layer 4 through exposure and development, and R, G and B pixel regions are defined, as shown in FIG. 15.

Figure 16:
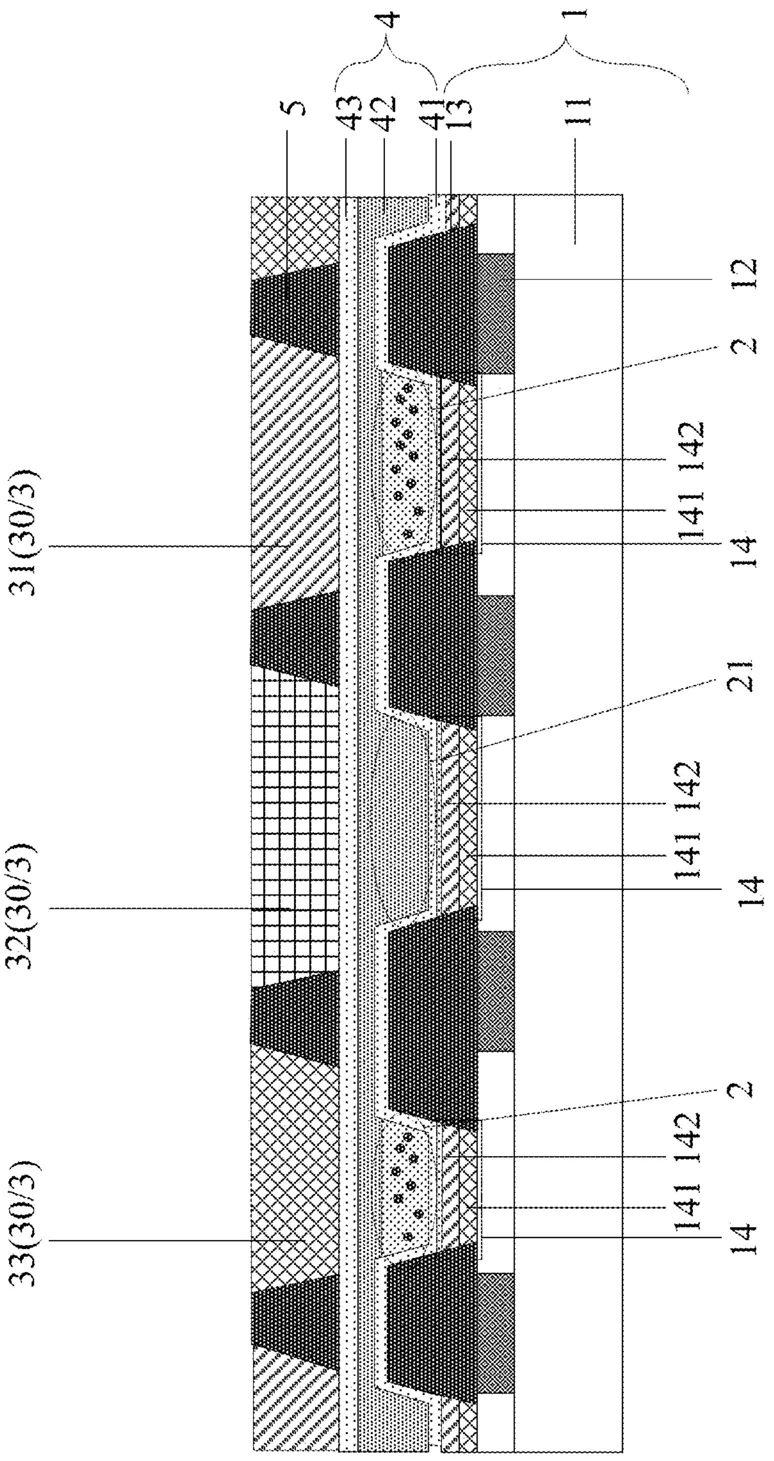
FIG. 16 is a schematic view showing forming a second wavelength conversion layer according to the embodiments of the present disclosure.

Step six, the blue light diffusion material, and R and G quantum dot inks are printed into corresponding pixel regions by means of ink-jet printing, and cured to form the second wavelength conversion patterns 30, as shown in FIG. 16.

Figure 17:
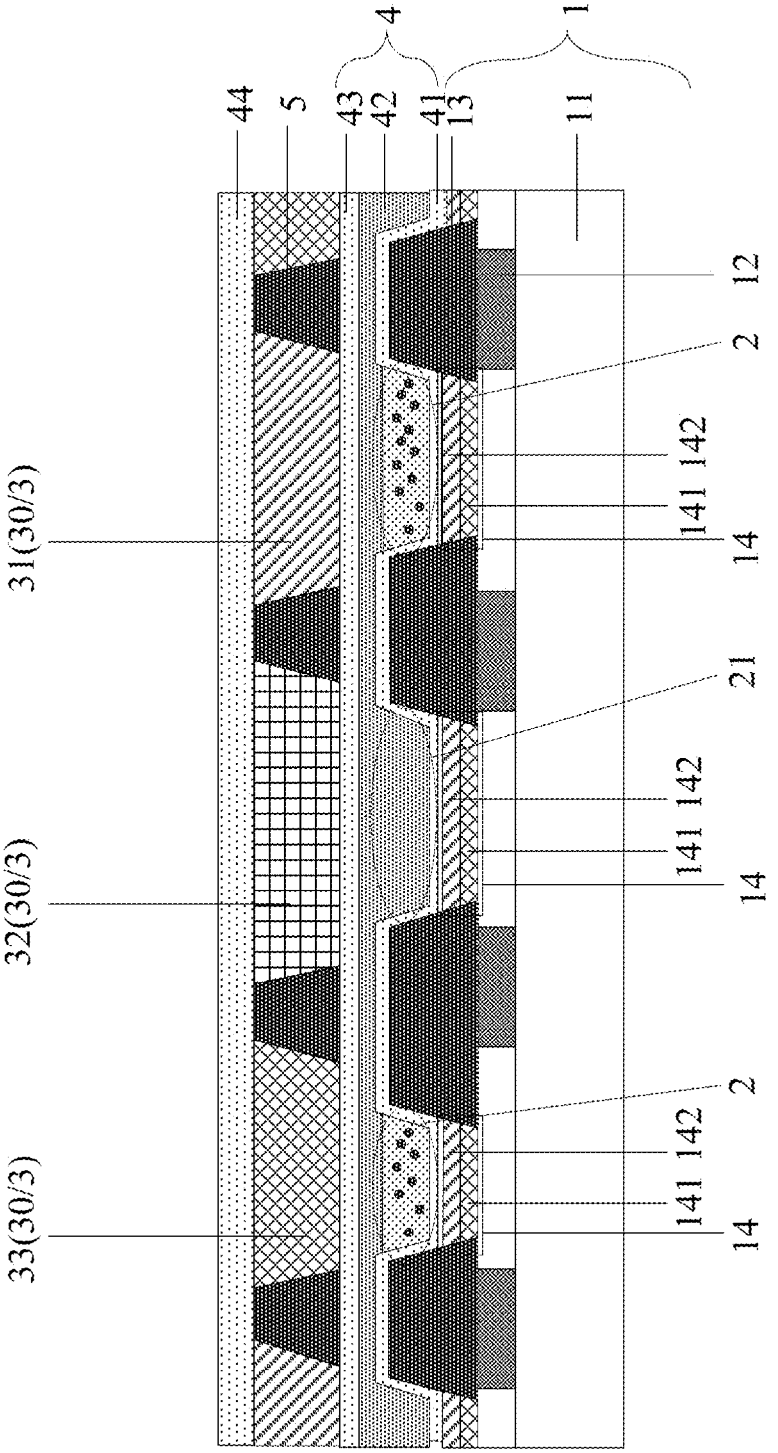
FIG. 17 is a schematic view showing forming a quantum dot encapsulation layer according to the embodiments of the present disclosure.

Step seven, the quantum dot encapsulation layer 44 (Encap-2) is formed, as shown in FIG. 17. The quantum dot encapsulation layer 44 is a high refractive index material with a refractive index in the range of 1.7-2.0, preferably 1.75-1.85, and a film thickness being smaller than 1 μm, preferably smaller than 0.5 μm.

Figure 18:
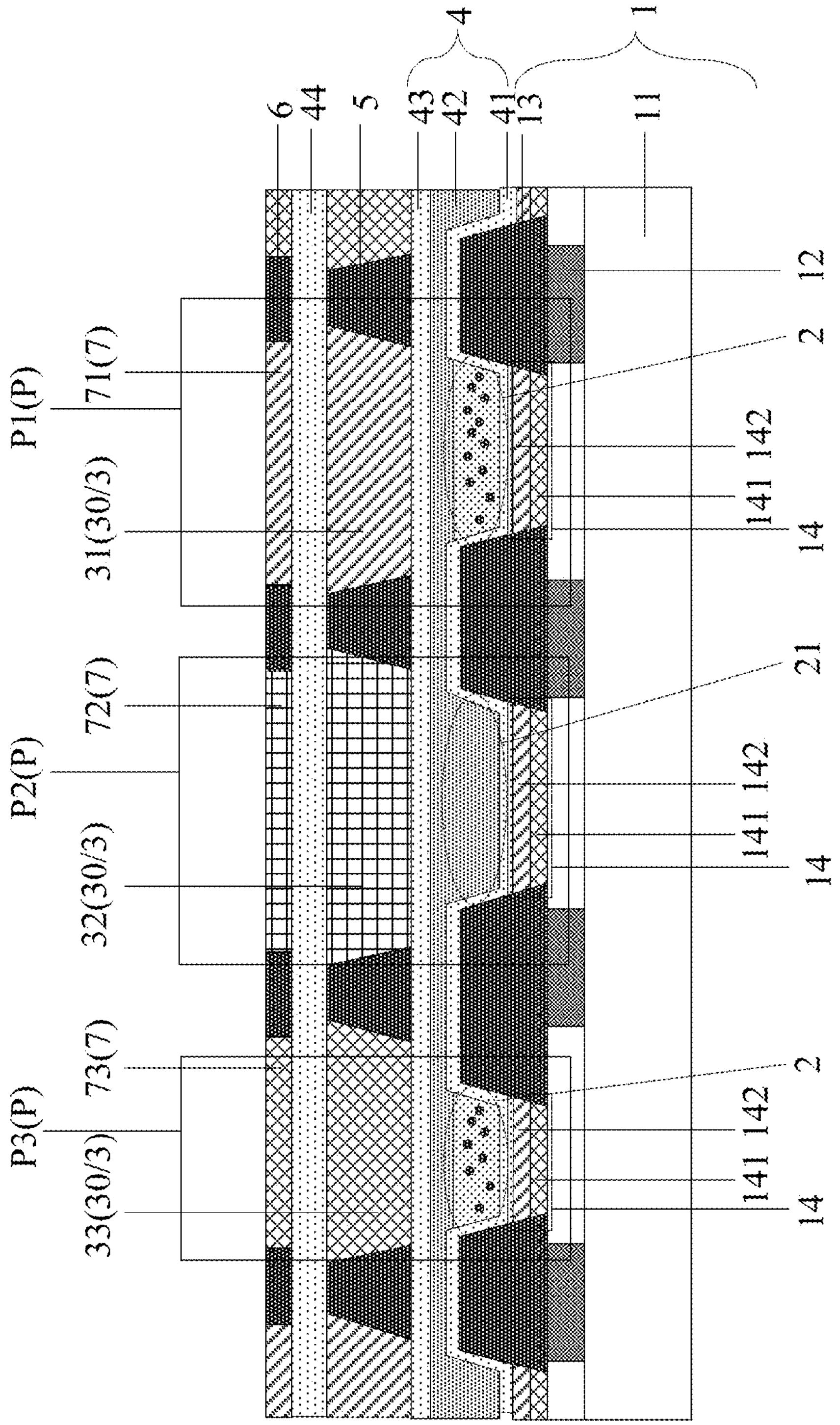
FIG. 18 is a schematic view showing forming a color film according to the embodiments of the present disclosure.

Step eight, the black matrix 6, and the color filters 7 arranged the third openings of the black matrix are formed, as shown in FIG. 18.

Figure 19:
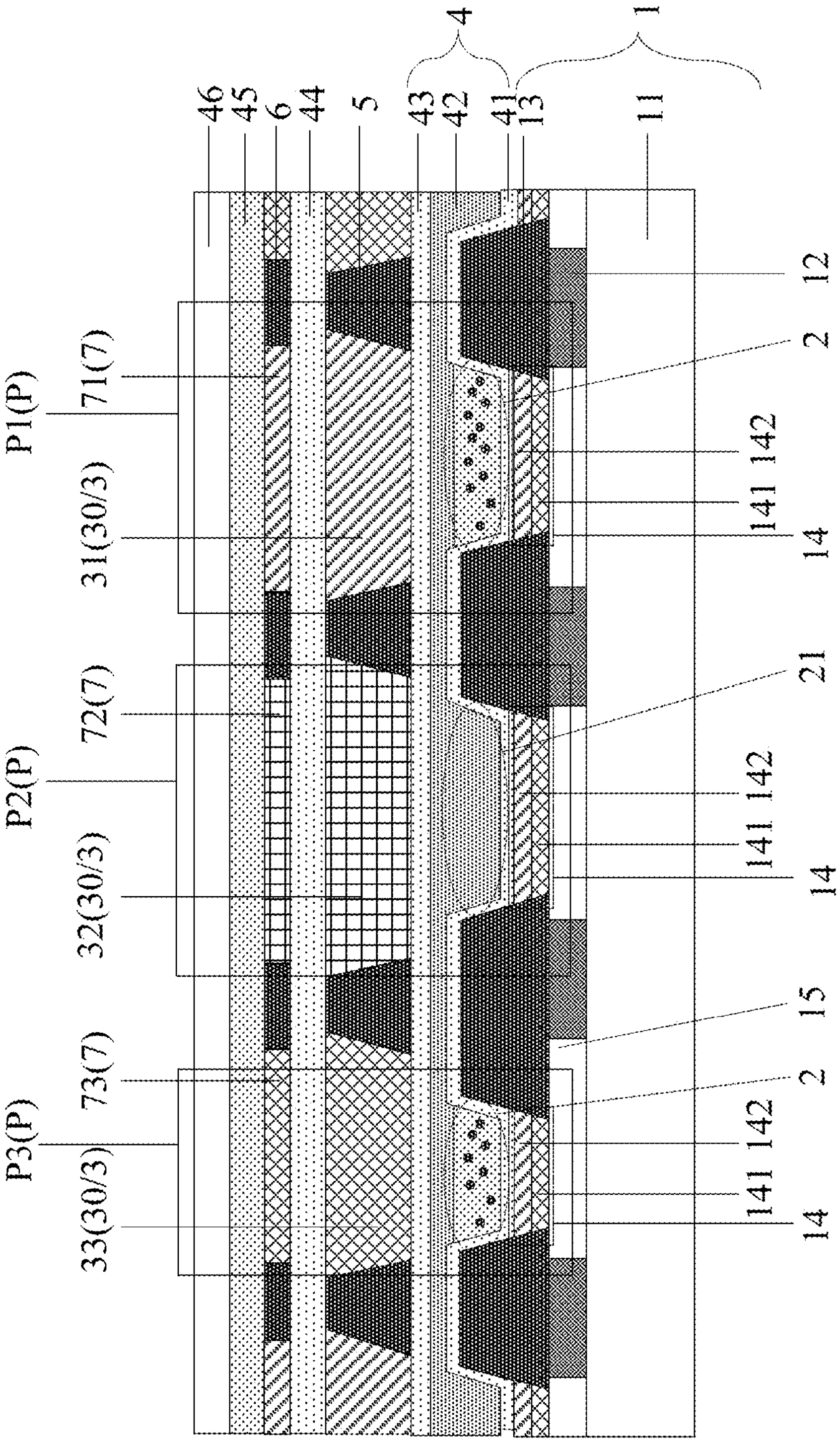
FIG. 19 is a schematic view showing forming a protective layer according to the embodiments of the present disclosure.

Step nine, the reflective polarizer 45 is formed or attached onto the black matrix 6, as shown in FIG. 19. The reflective polarizer 45 (e.g., a 3M DBEF film or a photocurable broad-spectrum liquid crystalline reflective polarizing film) having a slightly higher reflectivity in the blue band is preferred. The high protective layer 46 (cover film) having high transmittance, anti-scratch function, or other optical compensation films, are then attached as shown in FIG. 19.

In the embodiments of the present disclosure, the light-emitting structure 14 of the light-emitting substrate 1 includes one or more first light-emitting layers 141 emitting a first waveband light and one or more second light-emitting layers 142 emitting a second waveband light, the first wavelength conversion patterns 2 are arranged at the light-exiting side of at least part of the light-emitting structure 14, and the light emitted by the second light-emitting layer 142 may exit though or converted by the first wavelength conversion layer, thereby enhancing the light emitting brightness of the pixel and mitigating the problem of low overall brightness of the QD-OLED display panel.

While the preferred embodiments of the present disclosure have been described, additional variations and modifications to these embodiments may occur to those skilled in the art once the basic inventive concepts are known. It is therefore intended that the following appended claims are interpreted as including the preferred embodiments and all the variations and modifications which fall within the scope of the present disclosure.

Apparently, modifications and variations of the embodiments of the present disclosure may be made by those skilled in the art without departing from the spirit or scope of the embodiments of the present disclosure. Thus, in a case that the present disclosure covers the modifications and variations of the embodiments of the present disclosure which fall within the scope of the claims of the present disclosure and equivalent technologies thereof, the present disclosure is also intended to include these modifications and variations.

What is claimed is:

1. A display panel having a plurality of pixels, wherein the display panel comprises:

a light-emitting substrate, wherein the light-emitting substrate comprises a plurality of light-emitting structures corresponding to the pixels respectively, at least one light-emitting structure comprises one or more first light-emitting layers emitting a first waveband light and one or more second light-emitting layers emitting a second waveband light laminated one on another, and a wavelength of the first waveband light is smaller than a wavelength of the second waveband light;

a first wavelength conversion layer having a plurality of first wavelength conversion patterns corresponding to the light-emitting structures, the first wavelength conversion patterns being arranged at a light-exiting side of at least part of the light-emitting structures and configured to perform up-conversion on the second waveband light emitted through the second light-emitting layers; and a second wavelength conversion layer arranged on a side of the first wavelength conversion layer away from the light-emitting substrate and having a plurality of second wavelength conversion patterns corresponding to the light-emitting structures, the second wavelength conversion patterns being configured to perform down-conversion on light emitted through the first wavelength conversion layer.

2. The display panel according to claim 1, wherein the plurality of pixels comprises a red pixel, a green pixel and a blue pixel;

the first light-emitting layer emits blue light;

the second light-emitting layer emits green light; and the first wavelength conversion patterns are arranged at the light-exiting side of the light-emitting structures corresponding to the red pixel and the blue pixel.

3. The display panel according to claim 2, wherein the light-emitting structure comprises one first light-emitting layer and one second light-emitting layer;

or, wherein the light-emitting structure comprises two first light-emitting layers and one second light-emitting layer, the second light-emitting layer being arranged between the two first light-emitting layers;

wherein the two first light-emitting layers are made of a same light-emitting layer material.

4. The display panel according to claim 2, wherein a first wavelength conversion pattern corresponding to the red pixel is made of a material different from that of a first wavelength conversion pattern corresponding to the green pixel.

5. The display panel according to claim 1, wherein the plurality of pixels comprises a red pixel, a green pixel and a blue pixel;

the first light-emitting layer emits blue light;

the second light-emitting layer emits yellow light; and the first wavelength conversion patterns are arranged at the light-exiting side of the light-emitting structures corresponding to blue pixels.

6. The display panel according to claim 1, wherein the display panel comprises an encapsulation layer arranged between the light-emitting substrate and the second wavelength conversion layer, and the encapsulation layer comprises a first inorganic encapsulation layer, an organic encapsulation layer arranged on a side of the first inorganic encapsulation layer away from the light-emitting substrate, and a second inorganic encapsulation layer arranged on a side of the organic encapsulation layer away from the first inorganic encapsulation layer;

the first wavelength conversion layer is arranged between the first inorganic encapsulation layer and the organic encapsulation layer.

7. The display panel according to claim 6, wherein when the first wavelength conversion patterns are arranged at the light-exiting side of the light-emitting structures corresponding to the red pixel and the blue pixel, the organic encapsulation layer comprises a first filling part filled in the green pixel, and the first filling part has substantially a same thickness as the first wavelength conversion patterns.

8. The display panel according to claim 7, wherein when the first wavelength conversion patterns are arranged at the light-exiting side of the light-emitting structures corresponding to the blue pixels, the organic encapsulation layer comprises a second filling part filled in the green pixel and a third filling part filled in the red pixel; the second filling part and the third filling part have substantially a same thickness as the first wavelength conversion patterns.

9. The display panel according to claim 6, wherein at least one first wavelength conversion pattern comprises a base and luminescent particles dispersed in the base, a material of the luminescent particles comprising: a sulfate, and at least one of Sc, Y, La, Gd or Lu dispersed in the sulfate.

10. The display panel according to claim 9, wherein the base is made of a same material as the organic encapsulation layer.

11. The display panel according to claim 6, wherein the display panel further comprises: a first pixel definition layer configured to define the plurality of light-emitting structures, the first pixel definition layer having a plurality of first openings corresponding to the pixels respectively, the first wavelength conversion patterns being arranged within the first openings.

12. The display panel according to claim 11, wherein the display panel further comprises: a second pixel definition layer, the second pixel definition layer comprising a plurality of second openings, an orthographic projection of at least one second opening onto the light-emitting substrate covering an orthographic projection of a corresponding first opening onto the light-emitting substrate; and the second wavelength conversion patterns are filled in the second openings.

13. The display panel according to claim 1, wherein the display panel comprises a color film layer arranged on a side of the second wavelength conversion layer away from the first wavelength conversion layer, and the color film layer comprises a plurality of color filters corresponding to the pixels respectively;

the plurality of color filters comprises a red color filter that only allows red light to pass therethrough, a green color filter that only allows green light to pass therethrough, and a blue color filter that only allows blue light to pass therethrough.

14. The display panel according to claim 13, wherein the display panel further comprises a black matrix arranged on a side of the second pixel definition layer away from the encapsulation layer;

the black matrix has a plurality of third openings corresponding to the pixels, an orthographic projection of at least one third opening onto the light-emitting substrate substantially coincides with an orthographic projection of a corresponding second opening onto the light-emitting substrate, and the color filters are arranged in the third openings.

15. The display panel according to claim 1, wherein the second wavelength conversion layer is a quantum dot film layer.

16. The display panel according to claim 1, wherein the light-emitting structure further comprises: an anode and a cathode arranged opposite to each other; the first light-emitting layer and the second light-emitting layer are arranged between the anode and the cathode;

in a same light-emitting structure, a charge generation layer is provided between the first light-emitting layer and the second light-emitting layer, and the first light-emitting layer and the second light-emitting layer share the anode and the cathode.

17. A display device comprising the display panel according to claim 1.

18. A method for manufacturing a display panel, comprising:

forming a light-emitting substrate comprising a plurality of light-emitting structures, wherein at least one light-emitting structure comprises one or more first light-emitting layers emitting a first waveband light and one or more second light-emitting layers emitting a second waveband light laminated one on another, and a wavelength of the first waveband light is smaller than a wavelength of the second waveband light;

forming a first wavelength conversion layer having a plurality of first wavelength conversion patterns corresponding to the light-emitting structures at a light-exiting side of the light-emitting substrate, the first wavelength conversion patterns being arranged at the light-exiting side of at least part of the light-emitting structures and configured to perform up-conversion on the second waveband light emitted through the second light-emitting layers; and forming a second wavelength conversion layer having a plurality of second wavelength conversion patterns on a side of the first wavelength conversion layer away from the light-emitting substrate, the second wavelength conversion patterns being configured to perform down-conversion on light emitted through the first wavelength conversion layer.

19. The method according to claim 18, wherein the forming a first wavelength conversion layer having a plurality of first wavelength conversion patterns corresponding to the light-emitting structures at a light-exiting side of the light-emitting substrate, comprises:

forming a first inorganic encapsulation layer at the light-exiting side of the light-emitting structures;

printing a first ink at the light-exiting side of at least part of the light-emitting structures to form the first wavelength conversion patterns;

printing a second ink on a side of the first wavelength conversion patterns away from the first inorganic encapsulation layer to form an organic encapsulation layer; and forming a second inorganic encapsulation layer on a side of the organic encapsulation layer away from the first wavelength conversion patterns.

20. The method according to claim 19, wherein the printing a first ink at the light-exiting side of at least part of the light-emitting structures, comprises;

printing the second ink containing luminescent particles at the light-exiting side of at least part of the light-emitting structures.

* * * * *